US008507097B2

(12) United States Patent
Perry et al.

(10) Patent No.: US 8,507,097 B2
(45) Date of Patent: *Aug. 13, 2013

(54) MULTILAYER FILMS CONTAINING A FLUORINATED COPOLYMER RESIN LAYER AND A CROSS-LINKABLE IONOMERIC ENCAPSULANT LAYER

(75) Inventors: Penny L. Perry, Wilmington, DE (US); George Wyatt Prejean, Orange, TX (US); Sam Louis Samuels, Landenberg, PA (US)

(73) Assignee: E I du Pont de Nemours and Company, Wilmington, DE (US)

( * ) Notice: Subject to any disclaimer, the term of this patent is extended or adjusted under 35 U.S.C. 154(b) by 89 days.

This patent is subject to a terminal disclaimer.

(21) Appl. No.: 12/975,245

(22) Filed: Dec. 21, 2010

(65) Prior Publication Data

US 2012/0152323 A1    Jun. 21, 2012

(51) Int. Cl.
*B32B 27/00* (2006.01)
*B32B 37/02* (2006.01)
*B32B 38/00* (2006.01)
*H01L 31/048* (2006.01)

(52) U.S. Cl.
USPC ............. 428/421; 156/251; 156/60; 156/285; 136/251

(58) Field of Classification Search
USPC .................. 428/422, 421; 156/251, 60, 285; 136/251
See application file for complete search history.

(56) References Cited

U.S. PATENT DOCUMENTS

| | | | |
|---|---|---|---|
| 6,414,236 B1* | 7/2002 | Kataoka et al. ............... | 136/251 |
| 6,753,087 B2 | 6/2004 | Jing et al. | |
| 6,762,508 B1 | 7/2004 | Kiso et al. | |
| 6,797,222 B2 | 9/2004 | Hausmann et al. | |
| 6,963,120 B2 | 11/2005 | Shiozaki et al. | |
| 7,638,186 B2 | 12/2009 | Hull et al. | |
| 8,211,264 B2 | 7/2012 | Samuels | |
| 8,211,265 B2 | 7/2012 | Samuels | |
| 2005/0131147 A1* | 6/2005 | Brule ........................... | 525/178 |
| 2007/0218289 A1* | 9/2007 | Ando et al. ................. | 428/411.1 |
| 2007/0267059 A1 | 11/2007 | Nishijima et al. | |
| 2008/0023063 A1 | 1/2008 | Hayes et al. | |
| 2008/0023064 A1 | 1/2008 | Hayes et al. | |
| 2008/0099064 A1 | 5/2008 | Hayes | |
| 2008/0169023 A1 | 7/2008 | Nishijima et al. | |
| 2008/0196760 A1 | 8/2008 | Hayes et al. | |
| 2008/0220193 A1* | 9/2008 | Tohi et al. .................. | 428/36.92 |
| 2008/0264471 A1 | 10/2008 | Hayes | |
| 2008/0264481 A1 | 10/2008 | Hayes | |
| 2009/0120489 A1 | 5/2009 | Nishijima et al. | |
| 2009/0151773 A1* | 6/2009 | Hayes et al. .................. | 136/251 |
| 2009/0183773 A1 | 7/2009 | Samuels et al. | |
| 2009/0255571 A1 | 10/2009 | Xia et al. | |
| 2011/0023943 A1 | 2/2011 | Prejean | |
| 2012/0024348 A1 | 2/2012 | Prejean et al. | |
| 2012/0024351 A1 | 2/2012 | Prejean et al. | |
| 2012/0024450 A1 | 2/2012 | Samuels et al. | |
| 2012/0028049 A1 | 2/2012 | Prejean et al. | |

FOREIGN PATENT DOCUMENTS

| | | |
|---|---|---|
| EP | 0577985 B1 | 2/1997 |
| EP | 1065731 A2 | 1/2001 |
| FR | 2539419 A1 | 7/1984 |
| JP | 2000-186114 A | 7/2000 |
| JP | 2001-144313 A | 5/2001 |
| JP | 2004-031445 A | 1/2004 |
| JP | 2004-058583 A | 2/2004 |
| JP | 2006-032308 A | 2/2006 |
| JP | 2006-190867 A | 7/2006 |
| WO | 03/035744 A1 | 5/2003 |
| WO | 2004/019421 A1 | 3/2004 |
| WO | WO 2004019421 A1 * | 3/2004 |

OTHER PUBLICATIONS

PCT International Search Report and Written Opinion for International Application No. PCT/US2010/043909 dated Sep. 22, 2010.
Pern et al, Adhesion strength study of EVA encapsulants on glass substrates, Conference Paper, 2003, National Renewable Energy Laboratory, Golden Colorodo.

* cited by examiner

*Primary Examiner* — Michael M Bernshteyn
(74) *Attorney, Agent, or Firm* — Maria M. Kourtakis; Kelly Law Registry

(57) ABSTRACT

A multilayer film comprises a layer consisting essentially of a fluorinated copolymer resin and a layer consisting essentially of an ethylene copolymer ionomer blend. The ethylene copolymer ionomer blend, or the product of crosslinking the blend, can be used as an encapsulant layer for solar cells, and the multilayer film is useful as a component of photovoltaic modules. Methods for preparing the multilayer films and the photovoltaic modules are also described.

13 Claims, No Drawings

MULTILAYER FILMS CONTAINING A FLUORINATED COPOLYMER RESIN LAYER AND A CROSS-LINKABLE IONOMERIC ENCAPSULANT LAYER

FIELD OF THE INVENTION

The invention is directed to multilayer film structures comprising a layer comprising a fluorinated copolymer resin and a layer of an ethylene copolymer ionomer blend. The invention is further directed to methods for preparing the multilayer film structures and methods for preparing photovoltaic modules that comprise the multilayer film structures.

BACKGROUND OF THE INVENTION

Photovoltaic (PV) modules (also known as solar modules or solar cell modules) are used to produce electrical energy from sunlight, offering a more environmentally friendly alternative to traditional methods of electricity generation. Such modules are based on a variety of semiconductor cell systems that absorb light and convert it into electrical energy. These systems are typically categorized into two types, based on the light absorbing material used, i.e., bulk or wafer-based modules and thin film modules. Typically, individual cells are electrically connected in an array to form a module, and an array of modules can be connected together in a single installation to provide a desired amount of electricity.

When the light absorbing semiconductor material in each cell and the electrical components used to transfer the electrical energy produced by the cells are suitably protected from the environment, photovoltaic modules can last 25, 30, and even 40 or more years without significant degradation in performance. In a typical wafer-based photovoltaic module construction, the solar cell layer is positioned between two encapsulant layers, which are further positioned between frontsheet and backsheet layers. This construction provides weather resistance, UV resistance, moisture barrier properties, low dielectric constant, and high breakdown voltage.

Fluoropolymer films are recognized as important components in photovoltaic modules due to their excellent strength, weather resistance, UV resistance, moisture barrier properties, low dielectric constant, and high breakdown voltage. These films may be used in both wafer-based and thin film modules. For example, a fluoropolymer film, such as an ethylene-tetrafluoroethylene copolymer (ETFE) film, may be used as a frontsheet for a photovoltaic module instead of the more common glass layer. Challenges associated with using a fluoropolymer film as a frontsheet include providing the desired combination of barrier properties and transparency, as well as providing good adhesion to an adjacent encapsulant layer. For example, higher transparency will improve solar module efficiency in converting sunlight into electricity. Achieving higher transparency, however, typically requires the use of thinner fluoropolymer films, which also have reduced strength and poorer weather resistance, UV resistance, and moisture barrier properties. Furthermore, the reduced barrier properties of thinner films can result in more rapid degradation of the encapsulant layer, further reducing the overall performance of the module. ETFE films have become the most widely used fluoropolymer materials for manufacture of photovoltaic (PV) module frontsheets due to the excellent adhesion of ETFE to ethylene vinyl acetate copolymers (EVA), the most commonly used material for the encapsulant layer, due to its low cost, high clarity, low modulus, low initial viscosity, low equilibrium moisture level, and good heat resistance.

EVA copolymers have been favored encapsulant materials because they are characterized by low melting temperatures, which allows them to readily flow around and seal the solar cell components. However, the low melting temperature properties of EVA copolymers generally necessitate subsequent crosslinking of the polymer to provide suitable thermal stability of the resulting photocells.

Moreover, the use of crosslinkable EVA as an encapsulant is not trouble-free. For example, the liberation of acetic acid from EVA can lead to corrosion and yellowing of the EVA encapsulant. Also, because peroxides are often incorporated into the EVA encapsulant as part of the crosslinking reaction, the shelf life of the EVA encapsulant is reduced and decomposition of the peroxide results in evolution of oxygen which may cause bubble formation. Finally, it is necessary that the EVA sheet be produced at a very low extrusion temperature to prevent premature crosslinking, that is, crosslinking prior to lamination to form the solar cell module.

Therefore, alternative materials that exhibit higher thermal dimensional stability without prematurely crosslinking are of interest for use in encapsulant layers.

In the past, encapsulant materials have been compounded with silane coupling agents, including aminosilanes, to improve adhesion to fluoropolymer layers, (See e.g. U.S. Pat. Nos. 6,963,120 and 6,762,608; U.S. Patent application Publications 2009/10183773, 2009/0120489, 2009/0255571, 2008/1069023, 2008/0023063, 2008/0023064 and 2007/0267059; U.S. Provisional Patent Application Number 61/230,238; European Patent Application 1065731; French Patent 2539419 and Japanese Patent Applications 2000/186114, 2001/144313, 2004/031445, 2004/058583, 2006/032308 and 2006/190867), U.S. Pat. No. 6,753,087 discloses a multilayer structure including fluoropolymer bonded to a substrate. The structure is prepared by heating a bonding composition including an amino-substituted organosilane to form a bond. U.S. Patent Application Publications 2008/0023063, 2008/0023064, 2008/0264471 and 2008/0264481 describe solar cells in which one or both surfaces of any of the solar cell laminate layers may be treated with a silane that incorporates an amine function, U.S. Patent Application 12/1795,052, "Method for Preparing; Transparent Multilayer Film Structures Having a Perfluorinated Copolymer Resin Layer", filed Jun. 7, 2010 and U.S. patent application Ser. No. 12/795,076, "Method for Preparing Multilayer Structures Containing a Perfluorinated Copolymer Resin Layer", filed Jun. 7, 2010 disclose the use of aminosilanes as surface-treatment agents or additives for ethylene copolymer films adhered to fluoropolymer films useful as PV module components.

U.S. Pat. No. 7,638,186 and European Patent Application Publication EP577985 disclose the use of tetrafluorethylene-hexafluoropropylene copolymers, commonly referred to as FEP, as back sheet layers in photovoltaic modules. International Patent Application Publication WO2004/019421 discloses the use of FEP as a front sheet layer in photovoltaic modules.

There is a need for alternative encapsulant materials for use in photovoltaic modules that incorporate fluoropolymer films. Such materials would desirably exhibit a combination of good adhesion to fluoropolymer layers, particularly under adverse conditions, and high light transmittance, thereby enabling development of improved photovoltaic modules.

SUMMARY OF THE INVENTION

Provided herein is a transparent multilayer film laminate comprising:
A. a first film layer comprising a fluorinated copolymer resin composition wherein i) the fluorinated copolymer comprises copolymerized units of tetrafluoroethylene and copolymerized units of comonomers selected from the group consisting of ethylene, perfluorinated comonomer, and combinations thereof, and ii) at least one surface of the first film layer has been modified by a surface treatment; and
B. a second film layer consisting essentially of a blend composition, said blend composition comprising about 10 to about 90 wt % of an Ethylene Copolymer 1 and about 90 to about 10 wt % of an Ethylene Copolymer 2, based on the total weight of the blend composition; and said blend composition consisting essentially of an Ethylene Copolymer 1 and an Ethylene Copolymer 2; wherein said Ethylene Copolymer 1 consists essentially of copolymerized units of ethylene, optionally about 10 to about 40 wt % of copolymerized units of a first olefin having a formula of $CH_2=C(R^1)CO_2R^2$, and about 2 to about 30 wt % of copolymerized units of a second olefin having a formula of $CH_2=C(R^3)COOH$, wherein the weight percentages of the copolymerized units of the first olefin and of the second olefin are based on the total weight of said Ethylene Copolymer 1; wherein about 10 to about 90 wt % of the carboxylic acid groups are neutralized to form carboxylate salts; wherein $R^1$ represents hydrogen or an alkyl group, $R^2$ represents an alkyl group, and $R^3$ represents hydrogen or an alkyl group; and
wherein said Ethylene Copolymer 2 consists essentially of copolymerized units of ethylene, optionally about 20 to about 40 wt % of copolymerized units of the first olefin, and about 3 to about 15 wt % of copolymerized units of a third olefin having a formula of $CH_2=C(R^4)$-D, wherein the weight percentages of the copolymerized units of the first olefin and of the third olefin are based on the total weight of said Ethylene Copolymer 2; wherein $R^4$ represents hydrogen or an alkyl group; wherein -D represents a moiety selected from the group consisting of $-CO_2R^5$, $-CO_2R^6-R^5$, $-R^6-R^5$, $-O-R^5$, and $-R^5$; wherein $R^5$ represents a moiety containing an epoxy group and $R^6$ represents an alkylene group; with the proviso that none of said first, second or third olefins is a dicarboxylic acid or a di-ester, mono-ester or anhydride of the dicarboxylic acid;
wherein a surface of the second film layer is adhered to the modified surface of the first film layer. The multilayer film laminate is optionally characterized by i) having an average peel strength between the first film layer and the second film layer of greater than 1 lbf/in or greater than 5 lbf/in, measured after exposing the multilayer film laminate to conditions of 85° C. at 85% relative humidity for 1000 hours.

The transparent multilayer film may be used as an integrated frontsheet or backsheet in a photovoltaic module. Accordingly, further provided herein are photovoltaic modules comprising or produced from the multilayer films and methods for making the multilayer films and the photovoltaic modules.

DETAILED DESCRIPTION

The following definitions apply to the terms as used throughout this specification, unless otherwise limited in specific instances.

Unless otherwise defined, all technical and scientific terms used herein have the same meaning as commonly understood by one of ordinary skill in the art to which this invention belongs. In case of conflict, the specification, including definitions, will control.

As used herein, the terms "comprises," "comprising," "includes," "including," "containing," "characterized by," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus.

The transitional phrase "consisting of" excludes any element, step, or ingredient not specified in the claim, closing the claim to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at levels that are appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The term "substantially free", as used herein with respect to a composition and a component, refers to a composition that includes no more than an adventitious amount of the component. Stated alternatively, the composition includes no added amount of the component, only the amount that is commonly present in the raw materials from which the composition is produced. In some commercially available materials, the level of adventitious components is less than less than 2.5%, 1.0%, less than 0.5%, or less than 0.1% by weight, based on the weight of the commercially available material.

The term "neat", as used herein, refers to a composition or a component that is substantially free of all other materials.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

Unless stated otherwise, all percentages, parts, ratios, and like amounts, are defined by weight.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 18 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such. The term "dipolymer" refers to polymers consisting essentially of two comonomers, and the term "terpolymer" refers to polymers consisting essentially of three comonomers.

The terms "epoxy group", "ethylene oxide group" and "oxirane ring" are synonymous and used interchangeably herein to refer to a substituted or unsubstituted group having the formula —CROCR$_2$, wherein the oxygen atom is bound to both carbons and the carbons are bound to each other. When the R groups are hydrogen atoms, the ethylene oxide group is unsubstituted. The ethylene oxide group may be singly or multiply substituted. Stated alternatively, one, two or three of the R groups may be other than hydrogen atoms.

The terms "alkyl group" and "alkylene group", as used herein alone or in combined form, such as, for example, "alkoxy group", refer to saturated hydrocarbon groups that have from 1 to 8 carbon atoms and that may be branched or unbranched. An alkyl group has one bond to a carbon atom available for substitution, and an alkylene group has two bonds to one or more carbon atoms available for substitution.

The term "ionomer", as used herein, refers to a polymer that comprises ionic groups that are carboxylate salts, for example, ammonium carboxylates, alkali metal carboxylates, alkaline earth carboxylates, transition metal carboxylates or combinations of such carboxylates. Such polymers are generally produced by partially or fully neutralizing the carboxylic acid groups of precursor or parent polymers that are acid copolymers, as defined herein, for example by reaction with a base. An example of an ionomer as used herein is a zinc ionomer, for example a copolymer of ethylene and methacrylic acid wherein all or a portion of the carboxylic acid groups of the copolymerized methacrylic acid units are in the form of zinc carboxylates.

The term "solar cell" as used herein includes any article that can convert light into electrical energy. Solar cells useful in the invention include, but are not limited to, wafer-based solar cells (e.g., c-Si or μc-Si based solar cells), thin film solar cells (e.g., a-Si, μc-Si, CdTe, or CI(G)S based solar cells), and organic solar cells.

The terms "sheet", "layer" and "film" are used herein in their broad sense interchangeably. A "frontsheet" is a sheet, layer or film positioned as the outermost layer on the side of a photovoltaic module that faces a light source and may also be described as an incident layer. Because of its location, it is generally desirable that the frontsheet has high transparency to the desired incident light. It is also desirable that the frontsheet has high moisture barrier properties to prevent entry of moisture into the photovoltaic module, which can degrade the components or reduce the electrical efficiency of the photovoltaic module. A "backsheet" is a sheet, layer or film on the side of a photovoltaic module that faces away from a light source, and is often opaque. In some instances, it may be desirable to receive light from both sides of a device (e.g., a bifacial device), in which case a module may have transparent layers on both sides of the device.

"Encapsulant" layers are used to encase the voltage-generating solar cell layer to protect it from damage and hold it in place in the photovoltaic module. These layers are normally positioned between the solar cell layer and the incident layer and the backing layer. Suitable polymer materials for these encapsulant layers typically possess a combination of characteristics such as high transparency, high impact resistance, high penetration resistance, high moisture resistance, good ultraviolet (UV) light resistance, good long term thermal stability, adequate adhesion strength to frontsheets, backsheets, other rigid polymeric sheets and cell surfaces, and good long term weatherability.

An "integrated frontsheet" is a sheet, layer or film that combines an incident layer and an encapsulant layer. An "integrated backsheet" is a sheet, layer or film that combines a backing layer and an encapsulant layer.

A "laminate" is a structure that can be constructed by uniting two or more layers of materials together, optionally using pressure.

Finally, the terms "transparency" and "transparent" as used herein refer to the amount of light that can pass through or be transmitted through a material, compared to the light transmitted through air. "Light transmission level" as used herein is the percentage of light transmitted through a material compared to that transmitted through air. Increased light transmission for front sheet constructions is desirable, as it increases the amount of incident sunlight that reaches the solar cell layer. This enables improved efficiency of photovoltaic modules by allowing more solar energy to be available for conversion to electrical energy by the solar cells.

Organosilane coupling agents have been used in the past to improve adhesion between compositions used as encapsulant materials and various materials used in incident layers of photovoltaic modules. For example, ethylene/vinyl acetate (EVA) copolymer compositions used in photovoltaic module encapsulant layers generally include an organosilane coupling agent such as γ-methacryloxypropyltrimethoxysilane to facilitate bonding to other materials. See "Adhesion Strength Study of EVA Encapsulants on Glass Substrates" F. J. Pern and S. H. Glick, NCPV and Solar Program Review Meeting 2003 NREL/CD-520-33586, Page 942.

It has now been found that certain ethylene copolymer ionomer blends as described herein provide compositions that may exhibit adhesion to fluorinated copolymer resin films that is significantly enhanced compared to that of similar compositions comprising other polymeric materials. The enhanced adhesion may be attained without modifying the blends with silane coupling agents. Significantly enhanced adhesion, relative to other compositions, is expected to be observed after exposure to damp heat (85° C. at 85% relative humidity) for periods of 1000 hours or more as described in the test methods below.

In addition, the ethylene copolymer ionomer blends have the advantage of having higher melting points than EVA compositions previously used in photovoltaic modules.

It is further hypothesized that the particular ethylene copolymer ionomer blends described herein can be used to prepare a transparent laminate having unusually good adhesion properties. The laminate comprises a film layer that consists essentially of a fluorinated copolymer resin directly adhered to a second film layer that consists essentially of the ethylene copolymer ionomer blend. The laminate of fluorinated copolymer resin film and adhered film may have substantially enhanced interlayer adhesion properties compared to similar laminates that do not comprise an ethylene copolymer ionomer blend film layer. The ionomer compositions provide a weatherable multilayer film laminate that may have an unusual combination of high adhesivity and excellent transparency, and that may be particularly suited for use in photovoltaic modules. A weatherable multilayer film is a film in which the individual layers are well adhered to each other, such that the peel strength between the layers is greater than 5 lbf/in after exposure to 1000 hours of damp heat (85° C. at 85% relative humidity) as described in the test methods below.

The first layer of the multilayer film laminate of the invention comprises a fluorinated copolymer resin. Suitable fluorinated copolymer resin components of the first layer are tetrafluoroethylene (TFE) copolymers. That is, the polymer component will contain copolymerized units of tetrafluoroethylene and additional copolymerized monomers. These fluoropolymers are used to form transparent films having excellent moisture barrier properties and transparency.

The basic and novel characteristics of the multilayer laminate include transparency and interlayer adhesivity, more fully described below.

In addition, if non-fluorinated monomers are present as copolymerized units, the amount of such monomers should be limited so that the copolymer retains desirable fluoropolymer properties, i.e., weather resistance, solvent resistance and barrier properties. In certain films, the fluorinated copolymer resin is a copolymer of fluoroolefins and fluorinated vinyl ethers. Atoms other than fluorine and carbon may be present in the copolymer end groups, i.e., the groups that terminate the polymer chains.

The fluoropolymers, including perfluoropolymers, used herein are those that are melt-fabricable, that is, they are sufficiently flowable in the molten state that they can be fabricated by melt processing, for example by extrusion, to produce products having sufficient strength so as to be useful. The melt flow rate (MFR) or melt index (MI) of the fluoropolymers is preferably at least about 5 g/10 min, more preferably at least about 10 g/10 min, still more preferably at least about 15 g/10 min, even more preferably at least about 20 g/10 min, and most preferably, at least 26 g/10 min, as measured according to ASTM D 1238 at the temperature and load which are standard for the resin (see for example ASTM D 2116-91a and ASTM D 3307-93).

Fluoropolymers of note include ethylene-tetrafluoroethylene copolymers (ETFE). Commercial ETFE copolymers are typically ethylene-tetrafluoroethylene copolymers modified by incorporation of a small amount of an additional termonomer. Modified ETFE comprises from about 35 to about 65 mole percent of ethylene, about 65 to about 35 mole percent of tetrafluoroethylene, and a small amount of a copolymerizable vinyl monomer which is free of telogenic activity and which incorporates into the copolymer a side chain containing at least two carbon atoms, with the side chain having only single bonds between elements or comprising an aromatic ring. The term "small amount" in this context means up to about 5 mole percent of the ETFE copolymer. Preferably the ratio of ethylene to TFE in the copolymer is about 40:60 to 60:40 or about 50:50. The incorporation of a small amount of the termonomer provides significantly improved tensile strength, stiffness, flex life, impact strength, abrasion resistance and cut-through resistance over the unmodified copolymer.

Such modified ETFE copolymers are described in U.S. Pat. No. 3,624,250. Specifications for the copolymer and test methods for the as-produced copolymer are found in ASTM method D3159.

Of note are ETFE copolymers that incorporate perfluorobutyl-ethylene (3,3,4,4,5,5,6,6,6-nonafluorohexa-1-ene or PFBE) as a termonomer, including copolymers that contain 70 to 85 weight % TFE, 15 to 20 weight % ethylene and 2 to 5 weight % PFBE. Examples of such copolymers are those that contain 76.5 to 80.1 weight % TFE, 17.8 to 19.6 weight % ethylene, and 2.1 to 3.9 weight % PFBE.

ETFE copolymers are described in the Kirk-Othmer Encyclopedia of Chemical Technology (5th edition), 2006, volume 18, pages 316-329.

Alternatives to ETFE films that exhibit higher transparency or better barrier properties are desirable, particularly for use in flexible solar cell modules where the use of rigid glass is not feasible. One alternative is a film made from a perfluorinated copolymer resin such as tetrafluoro-ethylene-hexafluoropropylene copolymer (FEP). However, adhesion of perfluorinated copolymers such as FEP to common encapsulant materials can be significantly poorer than adhesion of ETFE to such materials. The ionomer compositions described herein, however, may provide excellent adhesion to FEP, even without modification by organosilanes.

The fluoropolymers used in the laminates and methods described herein include perfluoropolymers. As indicated by the prefix "per", the monovalent atoms bonded to the carbon atoms making up the polymer chain are all fluorine atoms.

If nonfluorinated monomers are used as comonomers, the amount that is copolymerized should be limited so that the copolymer retains the desirable properties of the perfluoropolymer, i.e., weather resistance, solvent resistance, barrier properties, etc. In one fluoropolymer, fluorinated comonomers include fluoroolefins and fluorinated vinyl ethers. Other atoms may be present in the polymer end groups, which are the groups that terminate the polymer chain.

Examples of suitable perfluoropolymers include copolymers of tetrafluoroethylene (TFE) with one or more perfluorinated polymerizable comonomers, including a perfluoroolefin having 3 to 8 carbon atoms, such as hexafluoropropylene (HFP), or perfluoro(alkyl vinyl ether) (PAVE) in which the linear or branched alkyl group contains 1 to 5 carbon atoms. Preferred PAVE monomers are those in which the alkyl group contains 1, 2, 3 or 4 carbon atoms, respectively known as perfluoro(methyl vinyl ether) (PMVE), perfluoro(ethyl vinyl ether) (PEVE), perfluoro(propyl vinyl ether) (PPVE), and perfluoro(butyl vinyl ether) (PBVE). The copolymer can be made using several PAVE monomers, such as the TFE/perfluoro(methyl vinyl ether)/perfluoro(propyl vinyl ether) copolymer, sometimes called MFA by the manufacturers (Ausimont USA of Thorofare, N.J. and the Saint-Gobain Corporation of Valley Forge, Pa.). The TFE/PAVE copolymers are most commonly referred to as PFA. They typically have at least about 1 weight % PAVE, including when the PAVE is PPVE or PEVE, and will typically contain about 1 to 15 weight % PAVE. When PAVE includes PMVE, the copolymer contains about 0.5 to 13 weight % of perfluoro(methyl vinyl ether) and about 0.5 to 3 weight % of PPVE, the remainder, which brings the total to 100 weight %, being TFE.

Tetrafluorethylene-hexafluoropropylene copolymers are preferred perfluoropolymers. These copolymers are commonly referred to as fluorinated ethylene propylene (FEP) polymers. The term "FEP copolymers" refers to copolymerized comonomers of tetrafluoroethylene (TFE) and hexafluoropropylene (HFP), optionally with any number of other copolymerized monomer units. The FEP copolymers may thus be dipolymers, terpolymers, tetrapolymers, and higher order copolymers.

In these copolymers, the HFP content is typically about 6 to 17 weight %, preferably 9 to 17 weight % (calculated from HFPI times 3.2). HFPI (HFP Index) is the ratio of infrared radiation (IR) absorbances at specified IR wavelengths as disclosed in U.S. Statutory Invention Registration H130. Preferably, the TFE/HFP copolymer includes a small amount of additional comonomer to enhance certain physical properties. The FEP copolymer can be TFE/HFP/perfluoro(alkyl vinyl ether) (PAVE), wherein the alkyl group contains 1 to 4 carbon atoms such as PEVE or PPVE. A preferred TFE/HFP copolymer is TFE/HFP/PAVE such as PEVE or PPVE, wherein the HFP content is about 6 to 17 weight %, preferably 9 to 17 weight %, and the PAVE content, preferably PEVE, is about 0.2 to 3 weight %, the remainder being TFE, thereby bringing the total weight percentage to 100 weight % of the copolymer.

Examples of useful FEP compositions are those described in U.S. Pat. Nos. 4,029,868; 5,677,404; and 6,541,588; U.S. Patent Application Publication 2007/292685 and in U.S. Statutory Invention Registration H130. The FEP may be partially crystalline. More specifically, it is not an elastomer. "Partially crystalline" polymers have some crystallinity and are characterized by a detectable melting point measured according to ASTM D 3418 and a melting endotherm of at least about 3 J/g.

Of note are terpolymers containing copolymerized units of HFP (about 6 to 10 weight %), less than 2 weight % of perfluoroethylvinylether PEVE (about 1.5 to 2 weight %), with the remainder of the copolymerized units being TFE units. For example, such a copolymer may contain 7.2 to 8.1 weight % of HFP, 1.5 to 1.8 weight % of PEVE and 90.1 to 91.3 weight % of TFE, with a nominal melt flow rate (MFR) of 6 to 8 gm/10 min as defined in ASTM D 2116 and a melting point of 260° C. to 270° C.

The first film layer of the multilayer film laminate of the invention comprises the above-described fluorinated copolymer resin. It may also comprise other components that do not adversely affect the transparency and adhesion of the fluorinated copolymer resin. For example, additives such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers may be present in the first layer. Generally, such additives are present in amounts of up to 20 weight percent of the first film layer composition, based on the weight of the total composition of the first layer. In many compositions, no more than 10 weight percent of additives is present. In other compositions, less than 2 weight percent of additives is present.

Transparent fluorinated copolymer film layers suitable for use in the film laminates of the invention may be formed by any suitable technique known to those skilled in the art. For example, the films may be extrusion cast and optionally oriented (for example by stretching or tentering) and heat stabilized. Desirably, perfluorinated copolymer resin films used in the invention are oriented to provide improved properties, such as improved toughness and tensile strength.

The transparent fluorinated copolymer resin film can have a thickness in the range of about 25 to 200 microns, or about 50 to 150 microns, or about 50 to 125 microns. The light transmission of the transparent fluorinated copolymer resin film is greater than about 90%, or greater than about 94%, or greater than about 97% in the visible region of the electromagnetic spectrum, where the visible region of the electromagnetic spectrum ranges from 380 to 780 nm. High transparency may also be observed in regions of the electromagnetic spectrum beyond the visible region, such as between 350 to 800 nm or higher.

The transparent fluorinated copolymer resin film of the first film layer is subjected to a surface treatment prior to lamination to the second film layer. This surface treatment modifies the surface of the film and may take any form known in the art, including flame treatments (see, e.g., U.S. Pat. Nos. 2,632,921; 2,648,097; 2,683,894; and 2,704,382), plasma treatments (see e.g., U.S. Pat. No. 4,732,814), electron beam treatments, oxidation treatments, chemical treatments, chromic acid treatments, hot air treatments, ozone treatments, ultraviolet light treatments, sand blast treatments, solvent treatments, and combinations of two or more of these techniques. A notable surface treatment is corona treatment (see, e.g., U.S. Pat. Nos. 3,030,290; 3,676,181; 6,726,979 and 6,972,068). Corona treatment can include use of reactive hydrocarbon vapors such as ketones, e.g., acetone, alcohols, p-chlorostyrene, acrylonitrile, propylene diamine, anhydrous ammonia, styrene sulfonic acid, carbon tetrachloride, tetraethylene pentamine, cyclohexylamine, tetraisopropyl titanate, decylamine, tetrahydrofuran, diethylene triamine, tertiary-butylamine, ethylene diamine, toluene-2,4-diisocyanate, glycidyl methacrylate, triethylene tetramine, hexane, triethylamine, methyl alcohol, vinyl acetate, methylisopropyl amine, vinyl butyl ether, methyl methacrylate, 2-vinyl pyrrolidone, methyl vinyl ketone, xylene or mixtures thereof.

When the fluorinated copolymer resin film is surface-treated, the resulting chemical or physical modification of the fluorinated copolymer resin or of the film surface provides a modified first film layer surface. The modified fluorinated copolymer surface is more amenable to further treatment, such as improved adhesion to other materials. Without being tied to any specific mechanism or theory, the surface treatment may create polar functionalization or increase the surface energy of the film.

FEP films that have been surface-treated as described above, such as the grade designated PV3151 commercially available from E. I. du Pont de Nemours and Company of Wilmington, Del., USA (hereinafter "DuPont"), are suitable for use in this invention.

In addition to corona treatment, the fluorinated copolymer resin film may also be surface-treated with an organosilane coupling agent prior to contacting the surface of the second layer. An organosilane coupling agent is a silane coupling agent that contains at least one carbon-silicon bond. The silicon atom may be bonded to three hydrolysable groups, such as methoxy-, ethoxy-, chloro-, or acetoxy-groups, and to an organoreactive group. Without being bound by any theory, the silane may bond to reactive moieties on the surface of the fluoropolymer via the hydrolysable groups and then may either react with or physically entangle with a polymer or other organic material via the organoreactive group.

Organosilane coupling agents may include a wide variety of organoreactive groups. Some examples of different types of organoreactive groups include amino, benzylamino, methacrylate, vinylbenzylamino, epoxy, chloropropyl, melamine, vinyl, ureido, mercapto, disulfide, and tetrasulfido groups. An organosilane coupling agent may include a single type of organoreactive group, a mixture of two or more groups of the same type, a mixture of two or more different types of groups, or a combination thereof. An example of a silane coupling agent is [3-(methacryloyloxy)propyl]trimethoxysilane (MAOPTMS or 3-(trimethoxysilyl) propyl methacrylate).

Preferably, the organosilane that is used to treat the fluorinated copolymer resin film is an aminosilane coupling agent. Examples of aminosilanes that are useful include 3-aminopropyltrimethoxysilane (APTMS), 3-aminopropyltriethoxysilane (APTES), N,N'-bis[(3-trimethoxy-silyl)propyl]ethylenediamine (dipodalAP), N-(2-aminoethyl)-3-aminopropyl-trimethoxysilane (AEAPTMS) and N-2-(vinylbenzylamino)-ethyl-amino-propyltrimethoxysilane (SMAEAPTMS), notably APTMS, APTES and AEAPTMS.

The organosilane coupling agent, such as an aminosilane, may be applied to the surface of one side of the fluorinated copolymer resin film, or it may be applied to the surfaces of both sides of the fluorinated copolymer resin film. Preferably, the surface or surfaces have been treated as described above, using any known technique including liquid phase (e.g., dip coating, spray coating, etc.) and gas phase (e.g., vapor deposition) techniques. Preferably, the aminosilane coupling agent may be applied as a liquid solution, generally a solution wherein the concentration of aminosilane is from 0.05 to 1% by weight. The aminosilane may be dissolved in a solution including a polar organic solvent and applied to a film using a dip coating technique, followed by drying to remove the solvent. The drying may occur at an elevated temperature, sufficient to drive off the liquid solvent. The polar organic solvent may be a low molecular weight alcohol, such as those having 8 or fewer, preferably 4 or fewer, carbon atoms, (e.g., methanol, ethanol, propanol, or isopropanol). The solution may include a mixture of a polar organic solvent and water. For example, a solution of 0.1 weight % of aminosilane in 95% alcohol (for example, 95% ethanol, 5% water) may be applied to the film, and then the film may be dried at a temperature of 100° C. A range of solution compositions and drying temperatures can be used. The composition and drying temperature will depend on the particular aminosilane used in combination with the solvent chosen, as well as the surface characteristics of the fluorinated copolymer resin film layer and the second ethylene terpolymer film layer to which it will be adhered.

Silane surface treatment of the fluorinated copolymer resin film layer may be used to enhance adhesion of the fluorinated copolymer resin to the second ethylene terpolymer film layer. The blends described herein for use in the second film layer, however, are expected to have good adhesion to fluorinated copolymer resin film layers without silane surface treatment of the fluorinated copolymer resin film layer.

The second film layer of the laminates of the invention consists essentially of an ethylene copolymer ionomer blend. The second film layer is substantially free of polymers other than the ethylene copolymers and ionomers. In this instance, the term "substantially free" means that less than 1 weight %, preferably less than 0.5 weight % of other polymers are present in the second film layer composition. Because the transparent multilayer film laminate is suitable for use as an integrated front sheet for a photovoltaic module, the second film layer is preferably able to function as an encapsulant layer. Alternatively, the second film layer may be used as an adhesive layer, which may provide excellent adhesion to both fluorinated copolymer resins and to other materials that can be used as encapsulant materials in photovoltaic modules.

The ethylene copolymer ionomer blend contains Ethylene Copolymer 1 and Ethylene Copolymer 2, or a product of at least partially crosslinking Ethylene Copolymers 1 and 2. Ethylene Copolymer 1 is a copolymer comprising copolymerized units of ethylene, optionally of a first olefin of the formula $CH_2=C(R^1)CO_2R^2$, and of a second olefin of the formula $CH_2=C(R^3)COOH$, wherein $R^1$ is hydrogen or an alkyl group; $R^2$ is an alkyl group, or $R^2$ is an alkyl group substituted with an —OH group, such as a hydroxyethyl group, or $R^2$ is an alkyl group substituted with an alkoxy group, such as a methoxyethyl or an ethoxyethyl group; and $R^3$ is hydrogen or an alkyl group.

Suitable first olefins having the formula $CH_2=C(R^1)CO_2R^2$ include, without limitation, methyl acrylate, methyl methacrylate, ethyl acrylate, ethyl methacrylate, butyl acrylate, and butyl methacrylate. Preferably, the first olefin having the formula $CH_2=C(R^1)CO_2R^2$ is n-butyl acrylate, methyl acrylate or iso-butyl acrylate. Suitable second olefins having the formula $CH_2=C(R^3)COOH$ include, without limitation, acrylic acids and methacrylic acids.

In addition, the Ethylene Copolymer 1 may optionally further comprise other suitable additional comonomers, such as unsaturated carboxylic acids having 2 to 10, or preferably 3 to 8 carbons, or derivatives thereof. Suitable acid derivatives include acid anhydrides, amides, and esters. Esters are preferred. Specific examples of preferred esters of unsaturated carboxylic acids include, but are not limited to, methyl acrylates, methyl methacrylates, ethyl acrylates, ethyl methacrylates, propyl acrylates, propyl methacrylates, isopropyl acrylates, isopropyl methacrylates, butyl acrylates, butyl methacrylates, isobutyl acrylates, isobutyl methacrylates, tert-butyl acrylates, tert-butyl methacrylates, octyl acrylates, octyl methacrylates, undecyl acrylates, undecyl methacrylates, octadecyl acrylates, octadecyl methacrylates, dodecyl acrylates, dodecyl methacrylates, 2-ethylhexyl acrylates, 2-ethylhexyl methacrylates, isobornyl acrylates, isobornyl methacrylates, lauryl acrylates, lauryl methacrylates, 2-hydroxyethyl acrylates, 2-hydroxyethyl methacrylates, glycidyl acrylates, glycidyl methacrylates, poly(ethylene glycol)acrylates, poly(ethylene glycol)methacrylates, poly(ethylene glycol) methyl ether acrylates, poly(ethylene glycol) methyl ether methacrylates, poly(ethylene glycol) behenyl ether acrylates, poly(ethylene glycol) behenyl ether methacrylates, poly(ethylene glycol) 4-nonylphenyl ether acrylates, poly (ethylene glycol) 4-nonylphenyl ether methacrylates, poly (ethylene glycol) phenyl ether acrylates, poly(ethylene glycol) phenyl ether methacrylates, vinyl acetates, vinyl propionates, and combinations of two or more thereof. Examples of preferred comonomers include, but are not limited to, methyl (meth)acrylates, butyl (meth)acrylates, vinyl acetates, and combinations of two or more thereof.

Neither the first olefin nor the second olefin nor the other suitable additional comonomer, however, is a dicarboxylic acid or a diester, monoester or anhydride of a dicarboxylic acid. Dicarboxylic acids include maleic acid, fumaric acid, itaconic acid, citraconic acid, mesaconic acid, and the like. In addition, Ethylene Copolymer 1 preferably does not incorporate other comonomers in any significant amount. Stated alternatively, it is preferable that Ethylene Copolymer 1 consist essentially of copolymerized residues of ethylene and the second olefin, or that Ethylene Copolymer 1 consist essentially of copolymerized residues of ethylene, the optional first olefin and the second olefin.

Ethylene Copolymer 1 comprises about 5 to about 40 wt %, or about 10 to about 35 wt %, or about 10 to about 30 wt % of copolymerized residues of the first olefin of formula $CH_2=C(R^1)CO_2R^2$, when the first olefin is present. Ethylene Copolymer 1 further comprises about 2 to about 30 wt %, or about 5 to about 20 wt %, or about 5 to about 15 wt %, based on the total weight of the copolymer, of copolymerized residues of the olefin of the formula $CH_2=C(R^3)COOH$. The remainder of Ethylene Copolymer 1 comprises copolymerized residues of ethylene and up to about 5 wt % of optional additional comonomers, if any. These weight percentages are based on the total weight of Ethylene Copolymer 1.

In fully protonated form, Ethylene Copolymer 1 has a melt flow rate or melt index (MFR or MI) of about 5 g/10 min or higher, about 10 g/10 min or higher, or about 30 to about 1000 g/10 min, or about 60 g/10 min or higher, or about 100 to about 500 g/10 min, as determined in accordance with ASTM D1238 at 190° C. and under a weight of 2.16 kg.

Ethylene Copolymer 1 is an ionomer. In particular, at least a portion of the carboxylic acid groups of Ethylene Copolymer 1 are neutralized to form carboxylate salts. Ionomers and methods of synthesizing ionomers have been described at length elsewhere, for example U.S. Pat. No. 5,028,674, and U.S. patent application Ser. No. 12/610,678, filed on Nov. 2, 2009, and the references cited therein. To obtain the ionomers used herein, the precursor acid copolymers may be neutralized by any conventional procedure, such as those described in U.S. Pat. Nos. 3,404,134 and 6,518,365.

Preferred neutralization levels are about 10% to about 90%, about 20% to about 60%, or about 15% to about 30%. Neutralization level is expressed as the weight percentage of the acid present in the ionomer that is neutralized. For example, if the ionomer contains 15 wt % of methacrylic acid and the neutralization level is 25%, then 3.75 wt % of the acid groups are neutralized, based on the total weight of the copolymer.

In addition, Ethylene Copolymer 1 when neutralized has a melt flow rate or melt index (MFR or MI) of about 1 g/10 min or higher, or about 5 to about 500 g/10 min, or about 10 to about 500 g/10 min, as determined in accordance with ASTM D1238 at 190° C. and under a weight of 2.16 kg.

Any stable cation and any combination of two or more stable cations are believed to be suitable as counterions to the carboxylate groups in the ionomer. Divalent cations, such as cations of alkaline earth metals and some transition metals, are preferred. Zinc is a preferred divalent cation. Still more preferably, Ethylene Copolymer 1 is a zinc ionomer in which the hydrogen atoms of about 10% to about 90%, about 20% to about 60%, or about 15% to about 30% of the carboxylic acid groups of the precursor acid are replaced by a charge-equivalent amount of zinc cations.

In one particular example, Ethylene Copolymer 1 is a zinc ionomer of a copolymer of ethylene/n-butyl acrylate/acrylic acid, such as those available from E. I. du Pont de Nemours and Company, Wilmington, Del. ("DuPont") under the trademark Surlyn®.

Ethylene Copolymer 2 is a copolymer comprising copolymerized units of ethylene, optionally of the first olefin of the formula $CH_2=C(R^1)CO_2R^2$, and of a third olefin of the formula $CH_2=C(R^4)D$, wherein $R^4$ is hydrogen or an alkyl group; D is selected from $-CO_2R^5$, $-CO_2R^6-R^5$, $-R^6-R^5$, $-O-R^5$, and $-R^5$; and wherein $R^6$ is an alkylene group and $R^5$ is a moiety containing an epoxy group, such as a glycidyl group, a 1,2-cyclohexenyl oxide group, or a 1,2-epoxy group. Like the first and the second olefins and the optional additional comonomers, the third olefin is also not a dicarboxylic acid or a di-ester, mono-ester or anhydride of a dicarboxylic acid.

In addition, the Ethylene Copolymer 2 may optionally further comprise other suitable additional comonomers, as described above with respect to Ethylene Copolymer 1. Preferably, however, Ethylene Copolymer 2 preferably does not contain other comonomers in any significant amount. Stated alternatively, it is preferable that Ethylene Copolymer 2 consist essentially of copolymerized residues of ethylene and the third olefin, or that Ethylene Copolymer 2 consist essentially of copolymerized residues of ethylene, the optional first olefin and the third olefin Whether the first olefin is present in Ethylene Copolymer 2 is independent of whether it is also present in Ethylene Copolymer 1, and vice versa. Moreover, when the first olefin is present in both of Ethylene Copolymers 1 and 2, the olefin itself may be the same or different in each of the copolymers. For example, Ethylene Copolymer 1 may be a copolymer of ethylene/n-butyl acrylate/acrylic acid and Ethylene Copolymer 2 may be a copolymer of ethylene/n-butyl acrylate/glycidyl methacrylate. Alternatively, Ethylene Copolymer 1 may be a copolymer of ethylene/methyl acrylate/acrylic acid and Ethylene Copolymer 2 may be a copolymer of ethylene/ethyl acrylate/glycidyl methacrylate.

Ethylene Copolymer 2 comprises about 3 to about 15 wt %, or about 3 to about 10 wt %, or about 4 to about 7 wt % of copolymerized residues of the third olefin of the formula $CH_2=C(R^4)-D$. It may optionally further comprise up to about 40 wt %, or about 5 to about 40 wt %, or about 10 to about 40 wt %, or about 20 to about 40 wt %, or about 20 to about 35 wt % of copolymerized residues of the first olefin of the formula $CH_2=C(R^1)CO_2R^2$. The remainder of Ethylene Copolymer 2 comprises copolymerized residues of ethylene and up to about 5 wt % of optional additional comonomers, if any. These weight percentages are based on the total weight of Ethylene Copolymer 2.

Preferably, Ethylene Copolymer 2 consists essentially of copolymerized residues of ethylene and the third olefin. Also preferably, Ethylene Copolymer 2 consists essentially of copolymerized residues of ethylene, the optional first olefin and the third olefin. In one particular example, the Ethylene Copolymer 2 is a copolymer of ethylene/n-butyl acrylate/ glycidyl methacrylate, such as those available from DuPont under the trademark Elvaloy®. In another particular example, Ethylene Copolymer 2 is a copolymer of ethylene and glycidyl methacrylate.

In addition, Ethylene Copolymer 2 has a melt flow rate of about 5 to about 300 or about 5 to about 100 g/10 min, as determined in accordance with ASTM D1238 at 190° C. and under a weight of 2.16 kg.

The ratio of the Ethylene Copolymer 1 and the Ethylene Copolymer 2 in the blend composition ranges from about 90:10 to about 10:90, or about 80:20 to about 20:80, or about 70:30 to about 30:70, or about 60:40 to about 40:60, or about 45:55 to 55:45, or the ratio is about 50:50 by weight based on the total weight of Ethylene Copolymer 1 and Ethylene Copolymer 2 in the blend composition.

The mole ratio of carboxylic acid and carboxylate groups in Ethylene Copolymer 1 to epoxy groups in Ethylene Copolymer 2 is preferably about 10:1 to 1:10, about 5:1 to 1:5, about 3:1 to 1:3, or about 2 to 1.

The blend composition of Ethylene Copolymer 1 and Ethylene Copolymer 2 can be prepared by any suitable process, such as melt blending, compounding, and extrusion to pelletized blend. Preferably, no water, no other solvents such as organic solvents and aromatic solvents, and no plasticizers are added to the Ethylene Copolymer 1 and Ethylene Copolymer 2 during the blending process. Stated alternatively, in a preferred process, neat Ethylene Copolymer 1 is combined with neat Ethylene Copolymer 2 in a melt process to form a neat blend composition. At no time during the preferred process do Ethylene Copolymers 1 and 2 include more than adventitious amounts of water, other solvent, or plasticizer.

During the blending and extruding processes, the temperature of the blend is preferably maintained at or below about 120° C., to prevent premature cross-linking. More preferably, the temperature of the blend is maintained at or below about 110° C., 105° C. or 100° C. At temperatures of about 100° C. or higher, the carboxylic acid groups or the carboxylate groups in Ethylene Copolymer 1 react with the epoxy groups in Ethylene Copolymer 2 to form a blend composition that is cross-linked. Without wishing to be bound by theory, it is believed that the cross-linking reaction between an ionomer comprising acrylic acid residues and a copolymer comprising residues of glycidyl methacrylate operates by a mechanism in which a carboxylic acid or carboxylate group of the ionomer reacts to open an epoxide ring to form a hydroxyalkyl ester linkage. The linkage may also be termed a beta-hydroxy ester.

Those of skill in the art are aware that the cross-linking reaction may well proceed at temperatures that are below 120° C., or below 100° C. The kinetics of the reaction, however, are such that the blend composition may be held at 120° C. or less, or at 100° C. or less, for a significant amount of time (up to about 15 minutes) without cross-linking to the extent that the blend composition becomes intractable for further processing.

In addition, those of skill in the art are able to determine an appropriate level of cross-linking based on the physical properties that are desired in the cross-linked encapsulant layer. For example, higher levels of cross-linking are correlated with a higher flex modulus, better high temperature adhesion, lower melt indices, and better heat resistance.

Those of skill in the art are also aware that the time required to obtain a desired level of cross-linking depends directly on the concentration of carboxylic acid groups and epoxy groups. Likewise, the time required to obtain a desired level of cross-linking depends inversely on the temperature at which the cross-linking reaction is carried out, and also depends inversely or in another negative logarithmic relationship on the melt index of the polymer blend.

Although the discussion above indicates that the cross-linking reaction requires heat, the reaction may also be carried out using catalysis, or by using a combination of heat and catalysis. Both acid and base catalysts are suitable, including without limitation, tertiary amines, phosphoric acid, Lewis acids such as boron trifluoride etherate ($BF_3.Et_2O$) and aluminum trichloride ($AlCl_3$), and substituted pyridines. Because acids can be corrosive, basic catalysts are preferred, and substituted pyridines such as 4-dimethylamino-pyridine are particularly preferred. When present, the amount of the catalyst is preferably about 20 to about 200 ppm, based on the total weight of the blend.

The effect of the catalyst on reaction times and reaction temperatures is known to those of skill in the art. Briefly, however, when a catalyst is present, the cross-linking reaction will be completed in a shorter time at a given reaction temperature, compared to a blend composition that includes the same Ethylene Copolymers 1 and 2 but no catalyst. Alternatively, the cross-linking reaction can be completed at a lower temperature, again compared to a blend composition that includes the same Ethylene Copolymers 1 and 2 but no catalyst. Those of skill in the art are capable of adjusting the amount of catalyst to attain the desired reaction temperature and time.

The composition used in the second film layer may further contain one or more non-polymeric additives, such as plasticizers, processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), dispersants, surfactants, chelating agents, coupling agents, reinforcement additives (e.g., glass fiber), and fillers. In general, the total amount of these additives is less than 10 wt %, less than 5 wt %, less than 2 wt % or less than 1 wt %, based on the total weight of the composition.

The multilayer film laminates of the invention may be prepared by contacting the first and second film layers and adhering the two layers by the application of heat and optionally pressure. The composition of the second layer of the multilayer laminate may be adhered to the modified surface of the fluorinated copolymer resin first film as a coating (via extrusion coating or other appropriate application methods), as a film or membrane, or as a layer of a laminate.

Extrusion coating involves melting the blend composition in an extruder and passing it through a slit die to form a molten polymer curtain which drops onto a moving film substrate comprising the first layer fluoropolymer composition. The blend coating is adhered by being pressed onto the substrate and quenched by a quench drum.

Alternatively, a film made of the second film layer composition may be adhered to a film made of the first layer fluorinated copolymer resin composition. A surface of the first fluorinated copolymer resin layer that has been surface-modified as described above is contacted with a surface of a film of the second film layer blend composition. Contact is made in such a manner that the fluorinated copolymer resin layer and the second film layer are arranged in overlying fashion. The resulting multilayer overlay (so termed prior to adhesion by heat and optional pressure or vacuum) may be used in a subsequent lamination step to provide a multilayer film laminate (so termed after the layers are adhered by heat and optional pressure or vacuum).

The first fluorinated resin copolymer film layer and the second ethylene copolymer blend film layer are adhered by the application of heat and optionally pressure or vacuum to form the transparent multilayer film laminates described herein. Sufficient heat is applied to the multilayer film structure to reach a temperature above the softening temperature of the second film layer so that it softens and adheres to the first fluorinated copolymer resin layer. In addition, one or more other layers may be in contact with one or more of the first or second film layers. No layers intervene between the first and second layers. Depending on the equipment used, lamination conditions, number of other layers present, and the like, it may be necessary to maintain the temperature at 10 to 30° C. higher than the softening temperature of the second film layer for a period of one to 10 minutes to achieve adhesion. Optionally, pressure or vacuum can be applied to the multilayer film structure during heating to ensure good contact between the layers. This provides a multilayer film laminate that exhibits excellent adhesion properties. Preferably, the laminate is formed at a temperature that is sufficiently high to crosslink Ethylene Copolymers 1 and 2.

In some laminates, it may be desirable to effect adhesion by contacting the second film layer with the first fluorinated copolymer resin film layer to form a multilayer film overlay, applying heat and passing the multilayer film structure through a nip. For example, the multilayer film structure may be heated in an oven at about 90° C. to about 110° C., or about 90° C. to about 100° C., for a period of time sufficient to soften the second layer (e.g. about 1 to about 5 minutes), and thereafter, the heated multilayer film structure is passed through a set of nip rolls so that the air in the void spaces between the individual layers may be squeezed out, and the edge of the multilayer film structure sealed. This forms a multilayer film laminate. The multilayer film laminate can be laid up with additional layers such as solar cell layers, backing sheets, etc., to provide a multilayer structure, which may also be referred to as a pre-press. The multilayer pre-press may then be placed in an air autoclave where the temperature is raised to about 100° C. to about 160° C., or about 110° C. to about 160° C., at a pressure of about 100 to about 300 psi (about 6.9 to about 20.7 bar), or about 200 psi (13.8 bar). These conditions may be maintained for about 5 to 10 minutes. After cooling, the excess air pressure is vented and the laminated product, here a photovoltaic module, is removed from the autoclave.

The multilayer film laminates described herein may also be produced through non-autoclave processes. Such non-autoclave processes are described, for example, in U.S. Pat. Nos. 3,234,062; 3,852,136; 4,341,576; 4,385,951; 4,398,979; 5,536,347; 5,853,516; 6,342,116 and 5,415,909; U.S. Patent Appln. Publn. No. 20040182493; European Patent No. EP1235683 B1; and Intl. Patent Appln. Publn. Nos. WO9101880 and WO03057478. Generally, the non-autoclave processes include heating the pre-lamination assembly and the application of vacuum, pressure or both. For example, the assembly may be successively passed through heating ovens and nip rolls.

A vacuum laminator may be used to adhere the fluorinated copolymer resin first film layer to the second film layer to provide a multilayer film laminate. The laminator comprises a platen base, on which the layers are placed in overlaying fashion for lamination. The laminator also comprises an enclosure that covers and completely surrounds the platen base. The region enclosed by the platen and enclosure may be evacuated. The laminator also comprises a flexible bladder within the enclosure attached to the top inner surface of the enclosure, which may be inflated to a pressure greater than the pressure in the evacuated region. For example, the pressure above the bladder may be atmospheric and the laminate may be held under vacuum beneath the bladder to remove air. When the bladder is inflated, the flexible surface of the bladder is pushed from the top of the enclosure toward the platen and applies a surface pressure to the multilayer overlay to ensure good thermal contact between the overlay and the platen. For lamination of the multilayer film structure, the laminator is preheated to a temperature above the softening temperature of the second film layer and held at that temperature throughout the lamination process.

Generally, when a vacuum laminator is used, one surface of the fluorinated copolymer resin first film is placed in contact with the surface of the second film layer such that the second film layer is positioned between the platen and the first film layer. Other layers may be placed between the second film layer and the platen for adhesion to the second film layer. Heat-resistant sheets may be placed under the second film layer to retard heat flow and allow deaeration and devolatilization of the sample. Release sheets may be placed under the second film layer and/or over the first film layer to prevent the layers from adhering to parts of the laminator. The multilayer film structure is placed on the platen and the enclosure of the laminator is lowered into place and sealed. Next, the region surrounding the multilayer film structure between the platen and enclosure of the laminator is evacuated (e.g. to a pressure of 1 mbar) to help further prevent the formation of voids, defects, and air pockets. Subsequently, the rubber bladder is inflated (e.g. to a pressure of 999 mbar) so that it presses against the multilayer film structure and ensures good thermal contact with the platen. Pressure and temperature are maintained for a sufficient period of time (for 1 to 10 minutes) to soften the second film layer and adhere it to the fluorinated copolymer resin first film layer and, if present, any additional layer contacting the surface of the second film layer opposite the fluorinated copolymer resin first film layer.

When the heating step is complete, the bladder is depressurized to 0 mbar so that it may be removed from contact with the multilayer film laminate. The enclosure is vented to atmospheric pressure, then unsealed and opened. The multilayer film laminate is removed from the platen and allowed to cool to room temperature.

With appropriate modifications, the lamination procedure can also be used to prepare photovoltaic modules including encapsulant layers, solar cell layers or backing layers as described below. The lamination methodology described herein is not the sole method of carrying out such laminations. For example, more advanced laminating equipment has retractable pins that hold the multilayer laminate structure above the heat source during the period necessary to effect contact and evacuation. This type of apparatus would obviate the need for heat resistant layers in most cases.

The transparent weatherable multilayer film laminate may be used as an integrated frontsheet for a photovoltaic module. The integrated frontsheet provides all the properties necessary to protect the electrical components of a photovoltaic module that might otherwise be provided by separate incident and encapsulant layers. Moreover, the integrated frontsheet can be attached directly to the solar cell layer of the module. In this conformation, the fluorinated copolymer resin film layer functions as the incident layer and the second film layer functions as an encapsulant layer.

Accordingly, further provided herein is a method for forming a photovoltaic module that comprises the above-described method for preparing a transparent multilayer film laminate and also further comprises a step of overlaying a solar cell layer with the transparent multilayer film laminate prepared by the process of the invention. Suitable photovoltaic modules, solar cell layers, encapsulant layers and additional layers used in these methods are described in greater detail below.

In one method, a solar cell layer is contacted with the transparent multilayer film laminate in a manner such that the surface of the second film layer that is opposite that which contacts the first fluorinated copolymer resin film layer will contact the solar cell layer. In this method, the area of the multilayer film laminate is larger than the area of the solar cell layer. Additionally, those portions of the transparent multilayer film laminate that extend beyond the perimeter of the solar cell layer are positioned so as to contact an encapsulant layer that may be formed of the same or different material as the second film layer of the transparent multilayer film laminate. The transparent multilayer film laminate is then adhered to the encapsulant layer by the application of heat and optionally pressure or vacuum to form a photovoltaic module.

The solar cell layer may be significantly thicker, with somewhat uneven surfaces with peaks and voids, than the other layers and irregular in shape, including spaces or voids between and around the solar cells and other components of the solar cell layer. Therefore, portions of the second film layer of the transparent multilayer film laminate will contact the encapsulant layer outside the perimeter of the solar cell layer and can be adhered when heat is applied. As used herein, the perimeter of the solar cell layer is the outline of the outer limits of the area encompassed by the solar cell layer. In many cases, it is desirable that the second film layer or the encapsulant layer flow into the spaces and closely encapsulate the solar cells and other components to physically consolidate the photovoltaic module. Therefore, during the lamination process, the second film layer or encapsulant sheet composition will melt or soften to some degree, and will typically flow around the peaks and fill the voids of the solar cell assembly.

Thus, it may be necessary to apply heat for a period of time sufficient to allow such flow, which may be longer than that needed for adhering thinner layers of a more regular shape. For example, heat may be applied in such a manner that the transparent multilayer film laminate is maintained above the softening point of the second film layer thereof or above the softening point of the additional encapsulant layer, whichever is higher, for 5 to 30 minutes to effectively consolidate the photovoltaic module.

Accordingly, when the thickness of the second film layer or additional encapsulant layer is provided herein, unless otherwise specified in limited circumstances, it is the thickness of the layer prior to lamination. In general, however, the second film layer or the encapsulant layer in the final module remains at an average total thickness of about 1 to about 120 mils (about 0.025 to about 3 mm), or about 10 to about 90 mils (about 0.25 to about 2.3 mm), or about 15 to about 60 mils (about 0.38 to about 1.5 mm), or about 15 to about 45 mils (about 0.38 to about 1.14 mm), or about 15 to about 35 mils (about 0.38 to about 0.89 mm).

The steps recited above may be accomplished using a vacuum lamination procedure similar to that described previously, with the modification that an encapsulant layer and a solar cell layer are included in a multilayer laminate structure with the transparent multilayer film structure that comprises the first perfluorinated copolymer resin film layer and the second film layer.

In addition, photovoltaic modules may be prepared as described above with the difference that an integrated frontsheet is assembled in combination with other layers to form the photovoltaic module by application of heat and optionally pressure or vacuum.

Another method includes contacting a surface of the second film layer with a fluorinated copolymer resin film to form a film overlay structure, overlaying a solar cell layer with the film overlay structure such that the second film layer is positioned with portions of the second film layer extending beyond the perimeter of the solar cell layer and contacting an encapsulant layer. Heat and optionally pressure or vacuum is applied to adhere the various layers to each other simultaneously.

Further provided are methods in which an additional layer is adhered to the surface of the encapsulant layer opposite the surface that contacts portions of the surface of the second film layer. The additional layer may be adhered to the encapsulant layer prior to, simultaneously with, or subsequently to contacting and adhering the second film layer to the above-described encapsulant layer.

For example, the encapsulant layer may be part of an integrated backsheet in which the encapsulant layer is adhered to an additional layer prior to contacting and adhering to the second film layer. Alternatively, the encapsulant layer may be contacted with the second film layer of the transparent multilayer film structure on one surface and another layer, such as a backsheet, on the opposite surface and adhered to both layers simultaneously. In another alternative, the encapsulant layer may be adhered to the second film layer of the transparent multilayer film structure and then subsequently be adhered to another layer, such as a backsheet.

In some cases, the encapsulant layer may also be surface-treated with an organosilane coupling agent such as an aminosilane to improve adhesion to the second film layer or the additional layer. Suitable organosilane coupling agents and aminosilanes are described above with respect to the fluorinated copolymer resin films.

In any of these cases, the second film layer of the transparent multilayer film laminate may be part of an integrated frontsheet in combination with the first fluorinated copolymer resin film layer. Alternatively, the first fluorinated copolymer resin film layer and second ethylene terpolymer film layer may adhered at the same time that the second ethylene terpolymer film layer of the transparent multilayer film laminate is adhered to the encapsulant layer.

The methods described above provide multilayer films and photovoltaic modules that are preferably characterized by an average peel strength between the first film layer and the second film layer of greater than 1 lbf/in, more preferably greater than 5 lbf/in, measured after exposing the film or photovoltaic module to conditions of 85° C. at 85% relative humidity (damp heat) for 1000 hours.

In a typical photovoltaic module construction, the solar cell layer is positioned between two encapsulant layers, which are further positioned between the frontsheet (or incident layer) and backsheet layers. In the methods described herein, a layer comprising a fluorinated copolymer resin film composition of a transparent multilayer film laminate serves as the frontsheet of a photovoltaic module and the second film layer of the transparent multilayer film laminate serves as an encapsulant layer. The combination may be provided in the form of the transparent multilayer film laminate described herein, also known as an integrated front sheet. As previously described, the second film layer and an additional encapsulant layer sandwich the solar cell layer and another layer (a backsheet layer) may also be adhered to the additional encapsulant layer.

Photovoltaic modules prepared by the methods described herein include, but are not limited to, wafer-based solar modules (e.g., c-Si or μc-Si based solar cells, as described above) and thin film solar modules (e.g., a-Si, μc-Si, CdTe, CIS, CIGS, light absorbing dyes, or organic semiconductor based solar cells). Within the solar cell layer, the solar cells may be electrically interconnected or arranged in a flat plane. In addition, the solar cell layer may further comprise electrical wiring, such as cross ribbons and bus bars.

Monocrystalline silicon (c-Si), poly- or multi-crystalline silicon (poly-Si or μc-Si) and ribbon silicon are the materials used most commonly in forming traditional wafer-based solar cells. Photovoltaic modules derived from wafer-based solar cells often comprise a series of self-supporting wafers (or cells) that are soldered together. The wafers generally have a thickness of between about 180 and about 240 μm.

Thin film solar cells are commonly formed from materials that include amorphous silicon (a-Si), microcrystalline silicon (μc-Si), cadmium telluride (CdTe), copper indium diselenide ($CuInSe_2$ or CIS), copper indium disulfide ($CuInS_2$), copper indium/gallium diselenide ($CuIn_xGa_{(1-x)}Se_2$ (where $0 \leq x \leq 1$) or CIGS), copper indium/gallium disulfide ($CuIn_xGa_{(1-x)}S_2$ (where $0 \leq x \leq 1$)), light absorbing dyes, and organic semiconductors. Thin film solar cells with a typical thickness of less than 2 μm are produced by depositing the semiconductor layers onto a superstrate or substrate formed of glass or a flexible film.

The polymeric materials used in the second film layer may be the same as, or different from, the polymeric material used in any optional additional encapsulant layer that may be present in the transparent multilayer film laminates and photovoltaic modules. Any optional additional encapsulant layers used in preparing transparent multilayer film and photovoltaic modules described herein may each comprise a polymeric material independently selected from the group consisting of olefin unsaturated carboxylic acid copolymers, ionomers of olefin unsaturated carboxylic acid copolymers, ethylene vinyl acetate copolymers, poly(vinyl acetals) (including acoustic grade poly(vinyl acetals)), polyurethanes, polyvinylchlorides, polyethylenes (e.g., linear low density polyethylenes), polyolefin block copolymer elastomers, copolymers of α-olefins and ethylenically unsaturated carboxylic acid esters (e.g. ethylene methyl acrylate copolymers and ethylene butyl acrylate copolymers), silicone elastomers, epoxy resins, and combinations of two or more thereof. Preferred additional encapsulant layers are described in detail in U.S. patent application Ser. No. 12/847,619, filed on Jul. 30, 2010. More preferred materials for additional encapsulant layers include, without limitation, ionomers available from DuPont under the Surlyn® trademark; encapsulant sheets available from DuPont in the PV5300 Series; ethylene/vinyl acetate copolymers available from DuPont under the Elvax® trademark; and ethylene/alkyl acrylate copolymers available from DuPont under the Elvaloy® AC trademark.

The composition used in the encapsulant layer and in the additional encapsulant layer may further contain one or more additives, such as processing aids, flow enhancing additives, lubricants, pigments, dyes, flame retardants, impact modifiers, nucleating agents, anti-blocking agents such as silica, thermal stabilizers, UV absorbers, UV stabilizers, hindered amine light stabilizers (HALS), silane coupling agents (described in greater detail above), dispersants, surfactants, chelating agents, coupling agents, reinforcement additives (e.g., glass fiber), and fillers. Ethylene vinyl acetate copolymer compositions also frequently contain crosslinking agents such as organic peroxides. Any of these additives are generally present in amounts of no more than 20 weight % of the encapsulant composition, or no more than 10 weight %, or no more than 1 or 2 weight %.

Suitable backsheet layers comprise polymers that include but are not limited to, polyesters (e.g., poly(ethylene terephthalate) and poly(ethylene naphthalate)), polycarbonate, polyolefins (e.g., polypropylene, polyethylene, and cyclic polyolefins), norbornene polymers, polystyrene (e.g., syndiotactic polystyrene), styrene-acrylate copolymers, acrylonitrile-styrene copolymers, polysulfones (e.g., polyethersulfone, polysulfone, etc.), nylons, poly(urethanes), acrylics, cellulose acetates (e.g., cellulose acetate, cellulose triacetates, etc.), cellophane, silicones, poly(vinyl chlorides) (e.g., poly(vinylidene chloride)), fluoropolymers (e.g., polyvinyl fluoride, polyvinylidene fluoride, polytetrafluoroethylene, and ethylene-tetrafluoroethylene copolymers), and combinations of two or more thereof. The polymeric film may be non-oriented, or uniaxially oriented, or biaxially oriented. A multilayer film of polyester (PET) sandwiched between two layers of polyvinyl fluoride (PVF) is a specific example of a backsheet. The multilayer film comprising a fluorinated copolymer resin first film layer adhered to an ethylene terpolymer second film layer described herein may alternatively be used as an integrated backsheet. When used as an integrated backsheet, the transparent multilayer film laminate may be used in combination with a similar or identical transparent multilayer film laminate used as an integrated frontsheet or with frontsheets or encapsulant layers of different compositions.

Bifacial solar cell modules may receive incident light from both sides of the device, and thus incorporate a transparent layer on both faces of the solar cell array. For example, a transparent multilayer film laminate as described herein may be used as a first frontsheet of a bifacial device, while a glass layer is used as a transparent backsheet. Alternatively, for a flexible bifacial module, transparent multilayer film laminates as described herein may be used on both sides of the device. The compositions of the front and back layers may be the same or different. For example, an FEP transparent layer may be used as a frontsheet on one side of the device with an ETFE transparent layer used on the other side of the device, or FEP layers may be used on both sides of the device.

The photovoltaic module may further comprise other functional film or sheet layers (e.g., dielectric layers or barrier layers) embedded within the module. For example, poly(ethylene terephthalate) films coated with a metal oxide coating, such as those disclosed in U.S. Pat. Nos. 6,521,825 and 6,818,819 and European Patent EP1182710, may function as oxygen and moisture barrier layers in the transparent multilayer film laminates or photovoltaic modules.

If desired, a layer of fiber (scrim) may also be included between the solar cell layers and encapsulant layers to facilitate deaeration during the lamination process or to serve as reinforcement for the encapsulant layers. The fiber may be a woven or nonwoven glass fiber or a networked mat of connected fibers. The use of such scrim layers is disclosed in, e.g., U.S. Pat. Nos. 5,583,057; 6,075,202; 6,204,443; 6,320,115; and 6,323,416 and European Patent EP0769818.

Any of the photovoltaic modules described above may be prepared using the methods described herein.

The invention has been described hereinabove with reference to specific embodiments. One of ordinary skill in the art appreciates, however, that one or more modifications or one or more other changes can be made without departing from the scope of the invention as set forth in the claims below. Accordingly, the specification is to be regarded in an illustrative rather than a restrictive sense and any and all such modifications and other changes are intended to be included within the scope of invention.

It is further to be appreciated that certain features of the invention which are, for clarity, described above and below in the context of separate embodiments, may also be provided in combination in a single embodiment. Conversely, various features of the invention that are, for brevity, described in the context of a single embodiment, may also be provided separately or in any sub-combination.

The following examples are provided to describe the invention in further detail. These examples, which set forth a preferred mode presently contemplated for carrying out the invention, are intended to illustrate and not to limit the invention.

EXAMPLES

Materials

Ionomer-1: a sodium ionomer (ethylene/methacrylic acid dipolymer, 11 weight % MAA, 37% neutralized, $Na^+$ cation, MI of ionomer 10 g/10 min).

Ionomer-2: a zinc ionomer (85 wt % ethylene/15 wt % methacrylic acid with 22% of the methacrylic groups neutralized, $Zn^{2+}$ cation, MI=14).

EBAGMA-1: a terpolymer containing 28 weight % copolymerized units of n-butyl acrylate and 5.25 weight % copolymerized units of glycidyl methacrylate, the remainder copolymerized units of ethylene, with MI of 12 g/10 minute.

Control EVA: a urethane EVA available from Stevens Urethanes, East Hampton, Mass.

Z6040 Silane: glycidoxypropyl trimethoxysilane, available from Dow Chemical, Midland, Mich.

FEP-1: a film, corona treated on one side, comprising a tetrafluoroethylene-hexafluoropropylene copolymer (7.2 to 8.1 weight % copolymerized units HFP, 1.5 to 1.8 weight copolymerized units PEVE and 90.1 to 91.3 weight copolymerized units TFE), nominal melt flow rate 6 to 8 gm/10 minutes as defined in ASTM D2116 and melting between 260° C. and 270° C., designated as PV3151, available from DuPont.

ETFE-1: a film, corona treated on one side, comprising an ethylene-tetrafluoroethylene copolymer (76.5 to 80.1 weight copolymerized units TFE, 17.8 to 19.6 weight % copolymerized units ethylene and 2.1 to 3.9 weight % copolymerized units PFBE), designated as PV3251, available from DuPont.

FEP-2: FEP-1 which has also been treated with aminopropyltrimethoxy-silane.

Control Example C1 and Examples 1 to 3

In Example 1, Ionomer-1 and EBAGMA-1 in a weight ratio of 60:40 are blended at 120° C. for 5 minutes in a Brabender mixer. Examples 2 and 3 are prepared similarly. The compositions of Control Example C1 and Examples 1, 2 and 3 are summarized in Table 1, in which the amount of each component in the composition is listed in parts per hundred by weight.

TABLE 1

| Component | C1 | 1 | 2 | 3 |
|---|---|---|---|---|
| Control EVA | 100 | | | |
| Ionomer-1 | | 60 | | |
| Ionomer-2 | | | 60 | 60 |
| EBAGMA-1 | | 40 | 40 | 40 |
| Z6040 Silane | | | | 0.5 |

Plaques having thickness of 30 mil are formed by compression molding portions of each blend at 120° C. for 5 minutes. Under these conditions, essentially no crosslinking occurs.

The compression-molded plaques without silane or any other primers are laminated to test fluoropolymer sheets using a vacuum bag lamination method. The samples are placed inside a plastic bag with a fitting to a vacuum source. Sample size is four inches by six inches. Samples are positioned in the bag in order from the bottom up: first glass plate, sample second layer, fluorinated copolymer resin film, Teflon® release sheet and second glass plate. A small piece of Teflon® film release sheet is placed between the fluorinated copolymer resin film and the sample second layer at one end of the overlay to provide an unadhered region to serve as an initiation point for subsequent peel tests. The bag is sealed, placed inside an oven and evacuated. The evacuated bag is heated from ambient to 140° C. (oven set temperature) over a 15-minute period and held for 5 minutes. The oven temperature is then brought to 170° C. and held for 10 minutes. At that time the oven heat is turned off and the sample is cooled to ambient temperature by opening the oven door. The heating not only laminates the second layer to the fluorinated copolymer film and the adjacent glass plate, but also crosslinks the second layer.

The adhesion between the second layer and the fluoropolymer film is tested by a 180 degree peel test as described above, initially after lamination and after damp heat treatment for a designated time as described above. Initial adhesion of each of Control Example C1 and Examples 1, 2 and 3 to the three fluoropolymer films is about equal. After exposure to damp heat conditions for 264 h, 600 h and 1024 h, however, the films of Examples 1, 2 and 3 exhibit improvements in adhesion to each of the three fluoropolymer films, compared to Control Example C1, after exposure to identical conditions for equal periods.

While certain of the preferred embodiments of this invention have been described and specifically exemplified above, it is not intended that the invention be limited to such embodiments. Various modifications may be made without departing from the scope and spirit of the invention, as set forth in the following claims.

The invention claimed is:

1. A transparent multilayer film comprising:
A. a first film layer comprising a fluorinated copolymer resin composition wherein i) the fluorinated copolymer comprises copolymerized units of tetrafluoroethylene and copolymerized units of comonomers selected from the group consisting of ethylene, perfluorinated comonomer, and combinations thereof, and ii) at least one surface of the first film layer has been modified by a surface treatment; and
B. a second film layer consisting essentially of a blend composition, said blend composition comprising about 10 to about 90 wt % of an Ethylene Copolymer 1 and about 90 to about 10 wt % of an Ethylene Copolymer 2, based on the total weight of the blend composition, and said blend composition consisting essentially of an Ethylene Copolymer 1 and an Ethylene Copolymer 2; said Ethylene Copolymer 1 consists essentially of copolymerized units of ethylene, optionally about 5 to about 40 wt % of copolymerized units of a first olefin having a formula of $CH_2$=$C(R^1)CO_2R^2$, and about 2 to about 30 wt % of copolymerized units of a second olefin having a formula of $CH_2$=$C(R^3)COOH$, wherein the weight percentages of the copolymerized units of the first olefin and of the second olefin are based on the total weight of said Ethylene Copolymer 1; wherein about 10 to about 90 wt % of the carboxylic acid groups are neutralized to form carboxylate salts; wherein $R^1$ represents hydrogen or an alkyl group, $R^2$ represents an alkyl group, and $R^3$ represents hydrogen or an alkyl group; and wherein said Ethylene Copolymer 2 consists essentially of copolymerized units of ethylene, optionally up to about 40 wt % of copolymerized units of the first olefin, and about 3 to about 15 wt % of copolymerized units of a third olefin having a formula of $CH_2=C(R^4)$-D, wherein the weight percentages of the copolymerized units of the first olefin and of the third olefin are based on the total weight of said Ethylene Copolymer 2; wherein $R^4$ represents hydrogen or an alkyl group; wherein -D represents a moiety selected from the group consisting of $—CO_2R^5$, $—CO_2R^6—R^5$, $—R^6—R^5$, $—O—R^5$, and $—R^5$; wherein $R^5$ represents a moiety containing an epoxy group and $R^6$ represents an alkylene group;

wherein the blend composition, being held at 120° C. for up to about 15 minutes, does not cross-link to the extent that the blend composition becomes intractable for further processing; and with the proviso that none of said first, second or third olefins is a dicarboxylic acid or a di-ester, mono-ester or anhydride of the dicarboxylic acid; and wherein a surface of the second film layer is adhered to the modified surface of the first film layer.

2. The transparent multilayer film of claim 1, wherein at least a portion of the carboxylate groups or the carboxylic acid groups of Ethylene Copolymer 1 are reacted with at least a portion of the epoxy groups of Ethylene Copolymer 2 to form cross-links between Ethylene Copolymer 1 and Ethylene Copolymer 2.

3. The transparent multilayer film of claim 1, wherein $R^1$ represents hydrogen or a methyl group, $R^2$ represents a butyl group, $R^3$ represents hydrogen or a methyl group, $R^4$ represents hydrogen or a methyl group, and -D is $—R^5$, wherein $R^5$ represents a moiety containing a glycidyl group.

4. The transparent multilayer film of claim 1, wherein the first olefin is n-butyl acrylate and the second olefin is acrylic acid or methacrylic acid.

5. The transparent multilayer film of claim 1, wherein the third olefin is glycidyl methacrylate.

6. A method for preparing the transparent multilayer film of claim 1, said method comprising the steps of:
   A. providing the first film layer:
   B. providing the second film layer;
   C. contacting a surface of the second film layer with the modified surface of the first film layer; and
   D. adhering the first film layer to the second film layer by the application of heat and optionally pressure or vacuum.

7. The method of claim 6 wherein the at least one surface of the first film layer is modified with an aminosilane.

8. A photovoltaic module comprising the transparent multilayer film of claim 1.

9. The photovoltaic module of claim 8, wherein the blend composition is at least partially crosslinked.

10. A method for preparing the photovoltaic module of claim 8, the method comprising the steps:
    A. providing a solar cell layer;
    B. providing area than the solar cell layer;
    C. overlaying the solar cell layer with the transparent multilayer film such that
       1. the surface of the second layer of the transparent multilayer film contacts the solar cell layer;
       2. a portion of the second layer of the transparent multilayer film extends beyond the perimeter of the solar cell layer; and
       3. the portion of the second layer of the transparent multilayer film that extends beyond the perimeter of the solar cell layer contacts another layer that is an encapsulant layer; and
    D. adhering the second layer of the transparent multilayer film to the encapsulant layer by the application of heat and optionally pressure or vacuum to provide a photovoltaic module.

11. The method of claim 10 wherein the encapsulant layer comprises a polymeric material selected from the group consisting of ethylene acid copolymers, ionomers of ethylene acid copolymers, ethylene vinyl acetate copolymers, poly (vinyl acetals), polyurethanes, polyvinylchlorides, polyethylenes, polyolefin block copolymer elastomers, copolymers of α-olefins and α,β-ethylenically unsaturated carboxylic acid esters, silicone elastomers, epoxy resins, and combinations of two or more thereof.

12. The method of claim 10 wherein an additional layer is adhered to the surface of the encapsulant layer opposite the surface that contacts portions of the surface of the second layer.

13. The method of claim 10 wherein the surface of the first film layer that is in contact with the second film layer is modified with an aminosilane.

* * * * *